United States Patent [19]
Shirai

[11] Patent Number: 5,541,877
[45] Date of Patent: Jul. 30, 1996

[54] NONVOLATILE SEMICONDUCTOR MEMORY DEVICE HAVING ELECTRIC FIELD BUFFERING MEANS

[75] Inventor: Hiroki Shirai, Tokyo, Japan

[73] Assignee: NEC Corporation, Japan

[21] Appl. No.: 524,851

[22] Filed: Sep. 7, 1995

[30] Foreign Application Priority Data

Sep. 14, 1994 [JP] Japan .................................. 6-220225

[51] Int. Cl.[6] ............................ G11C 7/00; H01L 21/265
[52] U.S. Cl. ................. 365/185.01; 365/185.24; 365/185.26; 365/185.29; 437/43
[58] Field of Search ...................... 365/185.01, 185.24, 365/185.26; 437/43

[56] References Cited

U.S. PATENT DOCUMENTS

5,153,144  10/1992  Komori et al. ............................ 437/43

Primary Examiner—David C. Nelms
Assistant Examiner—Trong Phan
Attorney, Agent, or Firm—Hayes, Soloway, Hennessey, Grossman & Hage

[57] ABSTRACT

Disclosed is an electrically erasable nonvolatile semiconductor memory device having a floating gate electrode formed on a semiconductor substrate through a first gate insulating film, a control gate electrode formed on the floating gate electrode through a second gate insulating film, and source and drain regions spaced apart from each other under the floating gate electrode so as to partially overlap the floating gate electrode, wherein an electric field buffering means for relaxing an electric field generated between a peripheral portion of an element isolation region and an end portion of the floating gate electrode in application of an erase voltage is selectively formed as a lightly doped region in a source region surface portion of the peripheral portion of the element isolation region.

2 Claims, 9 Drawing Sheets

NONVOLATILE SEMICONDUCTOR MEMORY DEVICE HAVING ELECTRIC FIELD BUFFERING MEANS

BACKGROUND OF THE INVENTION

1. Field of the Invention

The present invention relates to a nonvolatile semiconductor memory device and a method of manufacturing the same and, more particularly, to an electrically erasable and programmable read only memory (to be referred to as an EEPROM hereinafter) and a method of manufacturing the same.

2. Description of the Prior Art

Figure 1:
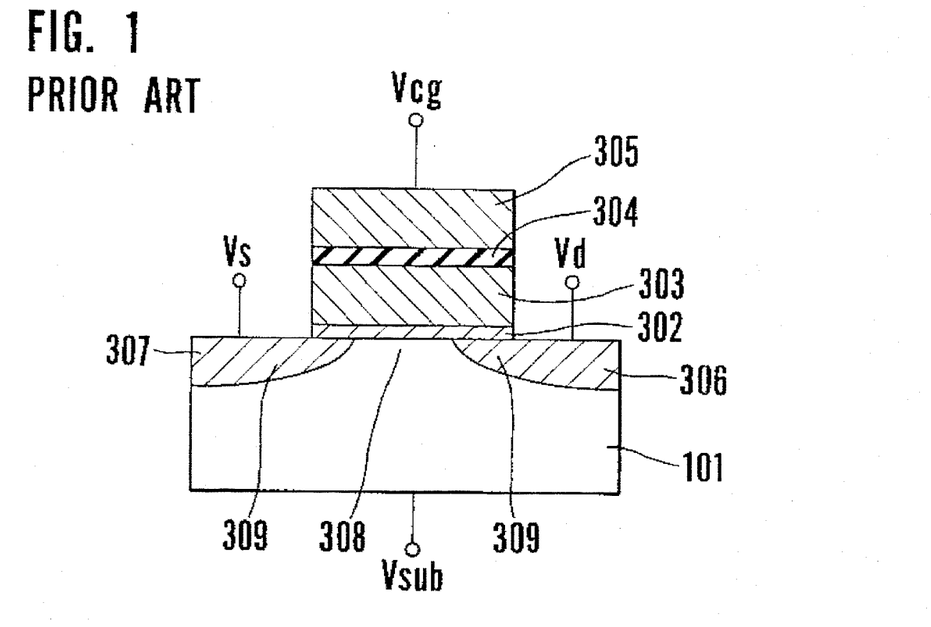
FIG. 1 is a sectional view of a memory cell of a conventional nonvolatile semiconductor memory device having a floating gate electrode.

Of all EEPROMs, a conventional flash memory having a function capable of electrically, simultaneously erasing data from a plurality of memory elements (EEPROM elements) generally has a stacked gate structure shown in FIG. 1.

More specifically, n-type source and drain regions 307 and 306 are formed in the surface region of a p-type silicon substrate 101. A 10-nm thick first gate oxide film 302 is formed on a channel region 308 between the source and drain regions 307 and 306 so as to extend to end portions 309 of the source and drain regions 307 and 306. A floating gate electrode 303 consisting of polysilicon is formed on the first gate oxide film 302, and a 25-nm thick second gate insulating film 304 is formed on the floating gate electrode 303. A control gate electrode 305 is formed on the second gate insulating film 304.

An operation of this conventional memory cell will be briefly described below.

In write access to the memory cell (data storage), a drain voltage Vd of, e.g., +7 V is applied to the drain region 306, and a substrate voltage Vsub and a source voltage Vs of 0 V (ground potential) are applied to the semiconductor substrate 101 and the source region 307, respectively. In addition, a gate voltage Vcg of, e.g., +12 V is applied to the control gate electrode 305. The floating gate electrode 303 is not connected to an external power supply, and the potential of the floating gate electrode 303 is determined uniquely from the potentials of the control gate electrode 305, the source region, the drain region, and the semiconductor substrate 101 in accordance with an electrostatic capacitance ratio of the first gate oxide film 302 and the second gate insulating film 304. When the potential of the floating gate electrode 303 is normally set almost equal to the potential of the drain region 306, hot electrons (electrons having an energy higher than the insulating energy of the first gate oxide film 302) generated by a current flowing between the source region 307 and the drain region 306 are injected into the floating gate electrode 303 in a maximum amount. For this reason, the voltages are often set as described above. As a result, the electrons are injected into the floating gate electrode 303, and the potential of the floating gate electrode 303 is suppressed to the negative level. The threshold voltage of the memory cell, i.e., the threshold voltage when viewed from the control gate electrode 305 is shifted to the positive direction. Normally, the threshold voltage of the memory cell is set about +7 V or more.

Erasure of data from the memory cell is to extract electrons injected as described above from the floating gate electrode 303. The gate voltage Vcg is set at −14 V, the substrate voltage Vsub is set at 5 V, and the source and drain regions 307 and 306 are set in an open state. The voltage values of the control gate electrode 305 and the substrate 101 are set to voltage values to relatively equalize the gate voltages with reference to the substrate 101. For example, the gate voltage Vcg of the control gate electrode 305 is set at 0 V, the substrate voltage Vsub is set at 19 V. Alternatively, the gate voltage Vcg of the control gate electrode 305 may be set at −19 V, and the substrate voltage Vsub may be set at 0 V. These voltage settings do not pose any problem on erasure.

As described above, the potential of the floating gate electrode 303 is determined in accordance with the potentials of the respective portions. A state in which data is written sets the floating gate electrode 303 to a negative potential. A potential difference is increased by this negative potential. A considerably strong electric field (20 MV/cm or more according to the above potentials of the respective parts) is applied to the gate oxide film 302 between the channel region 308 and the floating gate electrode 303. In this strong electric field, it is known that a Fowler-Noldheim current (to be referred to as an FN current hereinafter) based on the quantum-mechanical effect flows in the gate insulating film. By utilizing this effect, the electrons are extracted from the floating gate electrode 303 to the channel region 308 to erase data from the memory cell.

In the above description (this also applies to the following description), a state in which the electrons are injected into the floating gate electrode 303 to shift the threshold voltage of the memory cell to the positive direction is defined as "writing", while a state in which the electrons are extracted from the floating gate electrode 303 to shift the threshold voltage of the memory cell to the negative direction is defined as "erasure". However, the written and erased states may represent two different states of the memory cell and are not necessarily limited to the definitions described above.

Data is written in or erased from the memory cell as described above. A flash memory has the same write operation as described above. However, erasure of data from the flash memory is different from that described above. That is, voltages are simultaneously applied to the control gate electrode and the substrate in a state in which sources and drains of a memory cell array (memory cells in a matrix form) having a given size are kept in an open state. As a result, the data of all the memory cells of this memory cell array can be erased at once. Even if the storage capacity of a memory device increases, the erasure time can be shortened.

Assume that data are simultaneously erased from a memory cell array having a given size, e.g., a 256-kbit (32-kbyte) memory cell array. A difference of about 2 V in erase threshold voltage occurs between a memory cell having the highest erasure speed and a memory cell having a lowest erasure speed. In consideration of variations in erase threshold voltages, the erase threshold voltage must be determined to stop erasure of the entire memory array before the threshold voltage of the memory cell having the highest erasure speed becomes 0 V or less due to the following reason. When the threshold voltage of a given memory cell becomes 0 V or less, a bit line (column line) connected to this memory cell cannot increase the potential, and write/read access to all the memory cells connected to this bit line (column line) cannot be performed.

When the erasure is stopped before the threshold voltage of the memory cell having the highest speed becomes 0 V or less, the erase threshold voltage of the memory cell having the lowest erasure speed inevitably has a difference of 2 V or more in consideration of the above variations in threshold voltages. In practice, the threshold voltage of the memory cell having the highest erasure speed is not set to 0 V but set with a margin of 0.5 V to 1 V. Therefore, the threshold voltage of the memory cell having a lower erasure speed is set to 2.5 V to 3 V.

A method of manufacturing this conventional flash memory will be described below.

Figure 2:
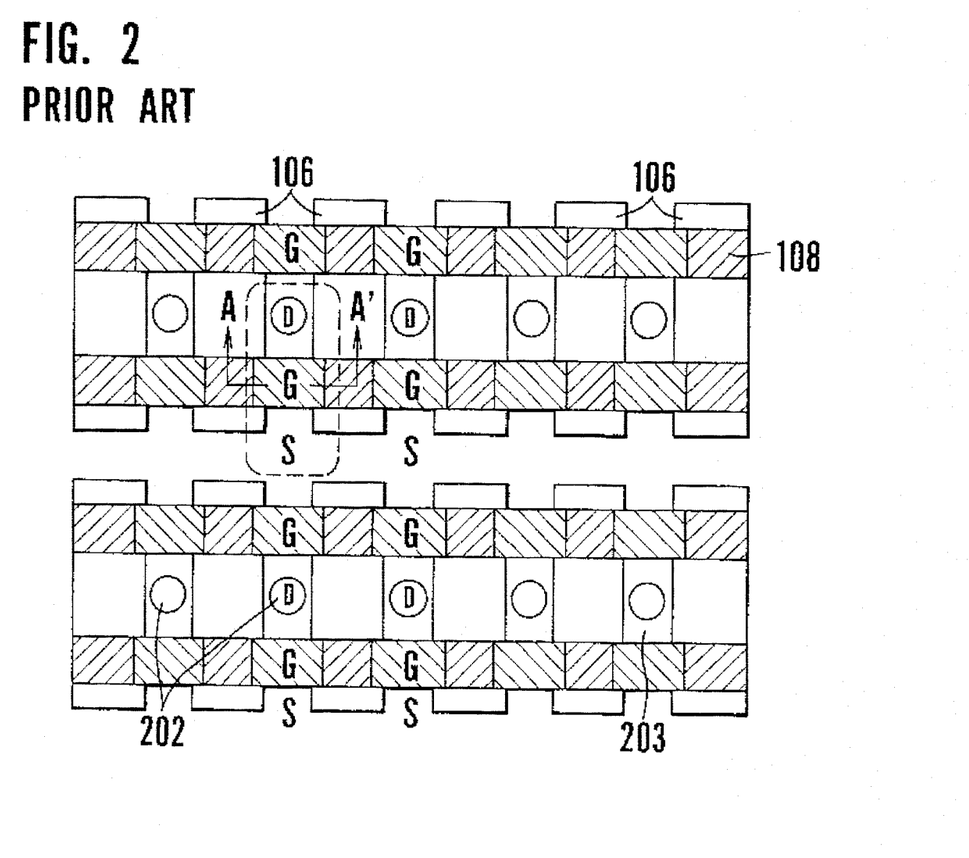
FIG. 2 is a plan view showing memory cells of the conventional nonvolatile semiconductor memory device.

FIG. 2 is a plan view showing a memory structure. One memory cell is surrounded by a dotted line in FIG. 2, and its manufacturing process will be described with reference to a section A—A' in FIG. 2. Referring to FIG. 2, reference symbol G denotes a gate region between the floating gate electrode 303 and the control gate electrode 305; S, a source region; and D, a drain region.

Figure 3A:
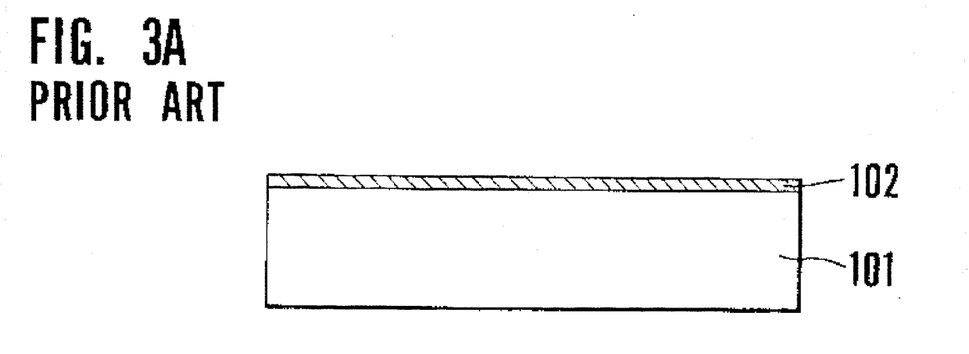
FIGS. 3A to 3K are process charts sequentially showing the steps in manufacturing a conventional nonvolatile semiconductor memory device along the section of a semiconductor chip.
Figure 3B:
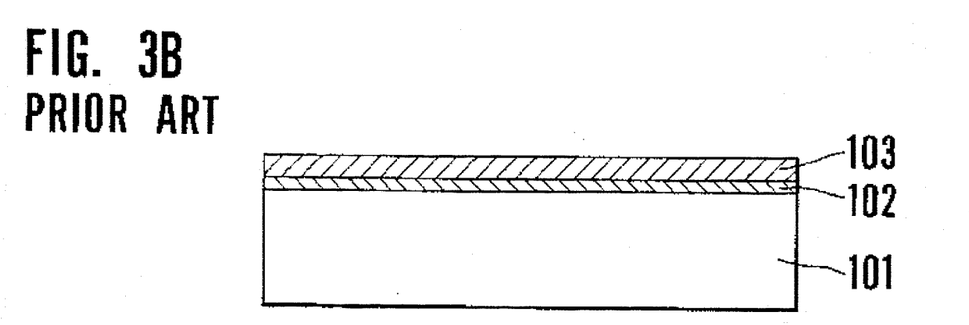
Figure 3C:
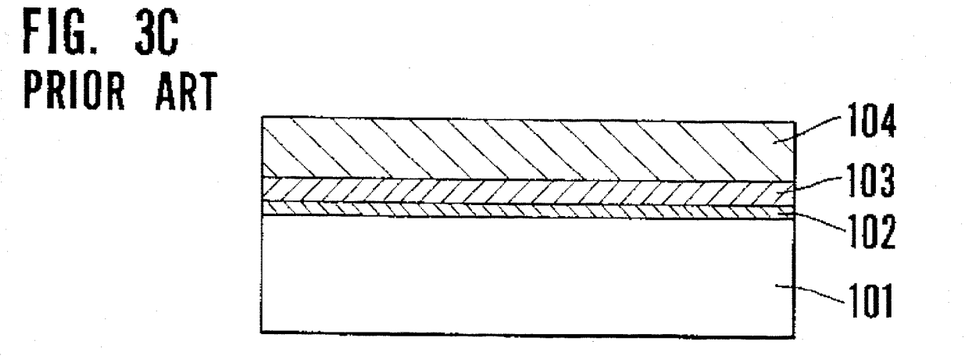
Figure 3D:
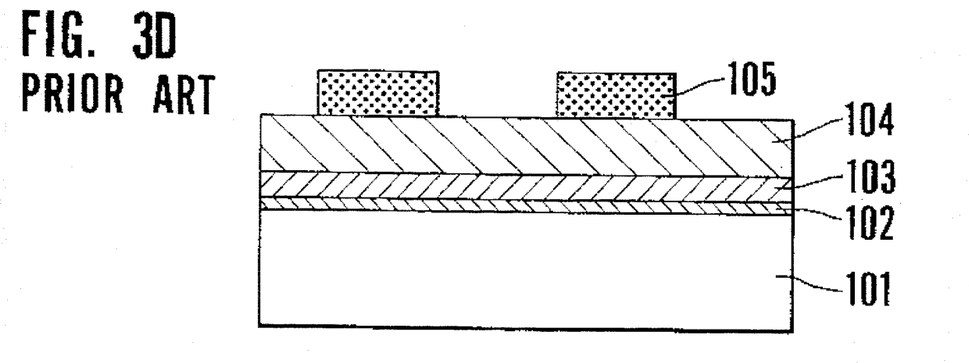

Referring to FIG. 3A, an oxide film 102 is formed on a p-type silicon substrate 101 to a thickness of, e.g., 45 nm. Polysilicon 103 is deposited on the oxide film 102 by CVD to a thickness of, e.g., 120 nm, as shown in FIG. 3B. A 300-nm thick nitride film 104 is formed on the polysilicon 103 by CVD, as shown in FIG. 3C. As shown in FIG. 3D, a photoresist 105 is patterned.

Figure 3E:
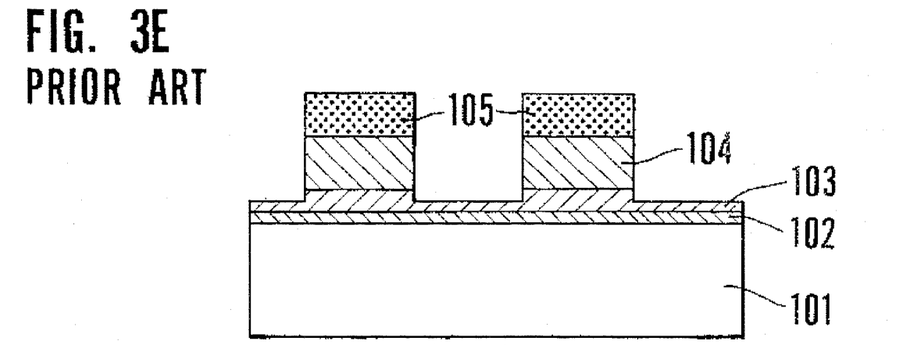
Figure 3F:
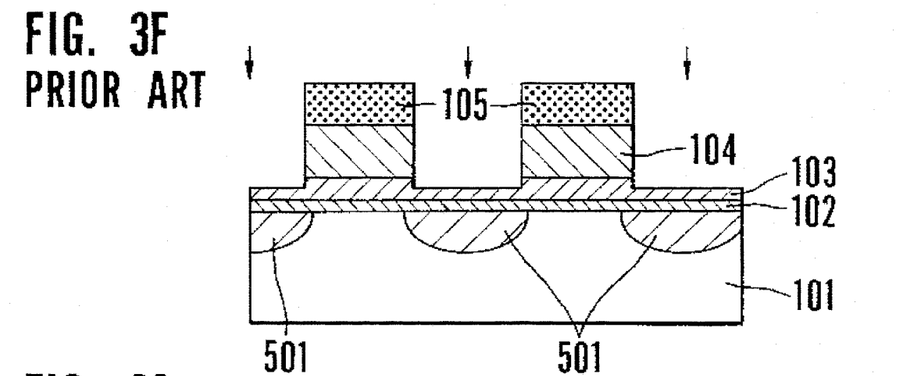
Figure 3G:
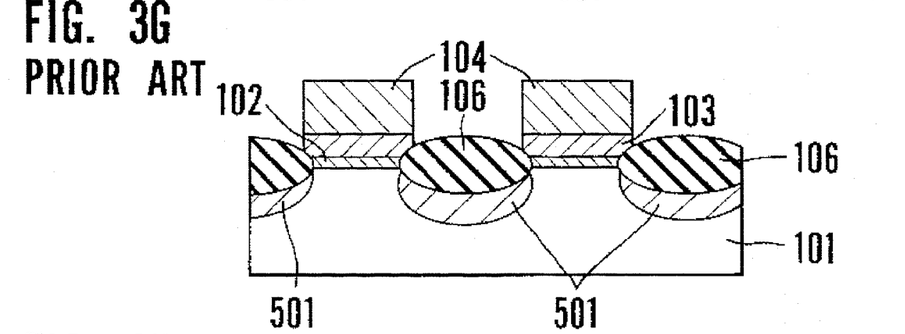
Figure 3H:
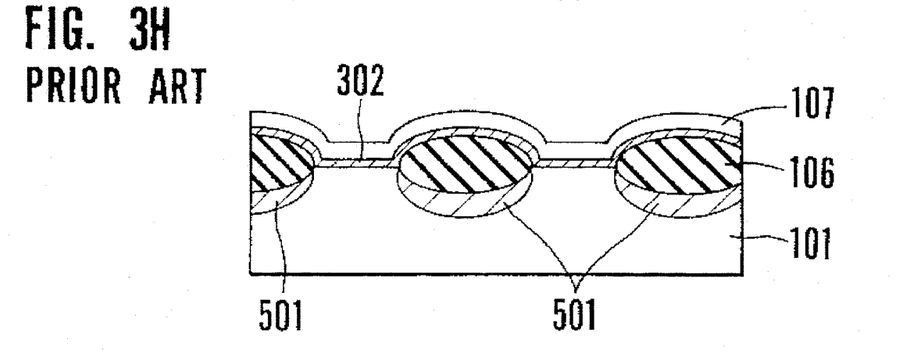

As shown in FIG. 3E, the nitride film 104 is etched using the photoresist 105 as a mask. As shown in FIG. 3F, boron is doped to form a channel stopper to electrically isolate the adjacent memory cells. As shown in FIG. 3G, oxidation is performed to form element isolation regions 106. As shown in FIG. 3H, a gate oxide film 302 is formed, and 150-mn thick first polysilicon 107 is grown on the gate oxide film 302.

Figure 3I:
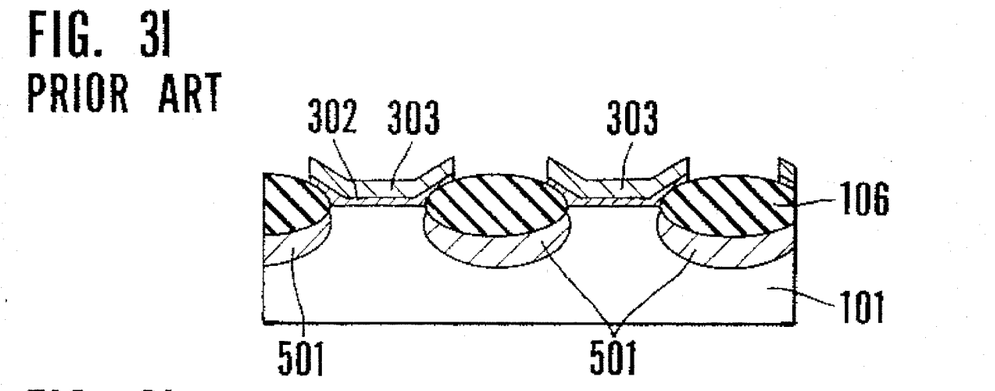
Figure 3J:
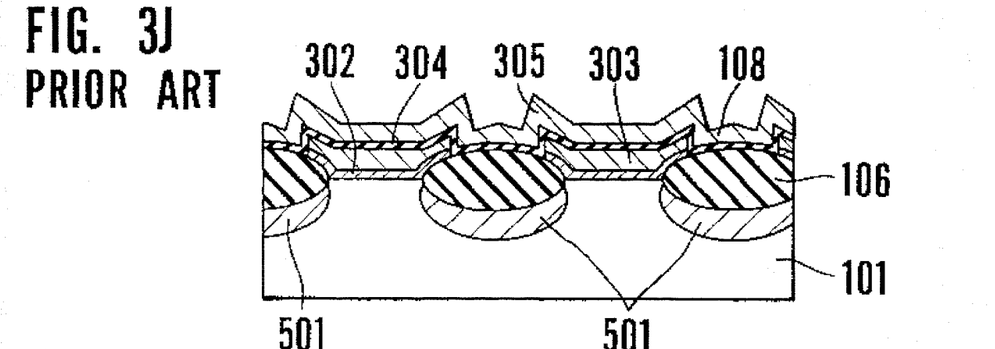
Figure 3K:
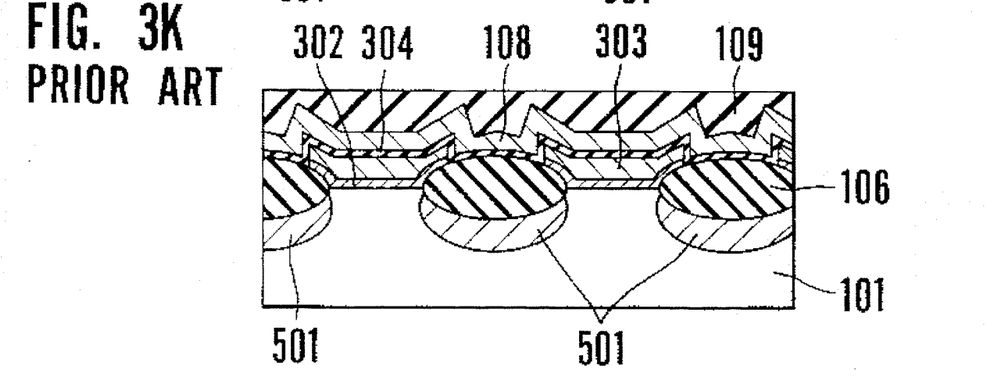

As shown in FIG. 3I, to form each polysilicon pattern which is formed into a floating gate electrode 303 later, an unnecessary portion is etched. As shown in FIG. 3J, a gate insulating film 304 and second polysilicon 108 are grown, and unnecessary portions thereof are etched to form floating gate and control gate electrodes 303 and 305. As shown in FIG. 3K, an insulating film 109 is grown, and contact holes are formed at necessary portions to electrically connect electrodes to corresponding diffusion layers, thereby forming each memory cell.

In the conventional flash memory as described above, the threshold voltages of the memory cells upon erasure undesirably vary due to the following reason. Erasure is performed by extracting the electrons from the floating gate electrode 303 to the channel region 308 by an FN current. With respect to an applied voltage, the FN current is determined by the thickness of the gate oxide film 302 and the area of the overlapping region between the channel region 308 and the floating gate electrode 303. These physical values slightly vary between a plurality of memory cells. The peripheral portion of the element isolation region is adversely affected by the shape in erasure. In simultaneous erasure of a plurality of memory cells, FN currents vary within a given range between the memory cells. When the FN current varies, the number of electrons extracted from the floating gate electrode 303 to the channel region 308 varies accordingly. The potentials of the floating gate electrodes cannot be kept at a predetermined value, and the threshold voltages of the memory cells upon erasure are inevitably different. When the threshold voltage greatly varies upon erasure, and even one excessively erased-cell is present on one bit line, subsequent write access cannot be performed. All the cells on this bit line are determined as defective cells. Only a remedy for this is to replace this bit line with a new one.

BRIEF SUMMARY OF THE INVENTION

The present invention has been made in consideration of the above problem, and has as its object to provide an electrically erasable nonvolatile semiconductor memory device constituted by a plurality of memory elements each having a floating gate electrode formed on a semiconductor substrate through a first gate insulating film, a control gate electrode formed on the floating gate electrode through a second gate insulating film, and source and drain regions spaced apart from each other under the floating gate electrode so as to partially overlap the floating gate electrode, wherein variations in a threshold voltage distribution upon erasure between a plurality of memory elements are suppressed in simultaneous electrical erasure of the plurality of memory elements, and a method of manufacturing the nonvolatile semiconductor memory device.

In order to achieve the above object according to the first aspect of the present invention, there is provided an electrically erasable nonvolatile semiconductor memory device having a floating gate electrode formed on a semiconductor substrate through a first gate insulating film, a control gate electrode formed on the floating gate electrode through a second gate insulating film, and source and drain regions spaced apart from each other under the floating gate electrode so as to partially overlap the floating gate electrode, comprising electric field buffering means for relaxing an electric field generated between a peripheral portion of an element isolation region and an end portion of the floating gate electrode in application of an erase voltage.

The electric field buffering means according to the first aspect is selectively formed as a lightly doped region in a source region surface portion of the peripheral portion of the element isolation region.

In order to achieve the above object according to the second aspect of the present invention, there is provided a method of manufacturing a nonvolatile semiconductor memory device, comprising the steps of: forming an oxide film on a semiconductor substrate, forming polysilicon on the oxide film, forming a nitride film on the polysilicon, etching the nitride film from a portion forming an element isolation region, doping an impurity having the same conductivity type as that of the semiconductor substrate to form a channel stopper, and forming electric field buffering means by obliquely injecting the impurity having the same conductivity type as that of the semiconductor substrate while rotating the substrate.

The impurity doping energy for forming the electric field buffering means according to the second aspect is lower than the impurity doping energy for forming the channel stopper. The doping direction of the impurity for forming the electric field buffering means falls within a range of 30° to 60° with respect to a normal to the semiconductor substrate.

According to the present invention, when the electric field buffering means is formed, the electric field generated between the peripheral portion of the element isolation region and the floating gate electrode upon application of the erase voltage can be relaxed.

The above and other advantages, features and additional objects of the present invention will become manifest to those versed in the art upon making reference to the following detailed description and accompanying drawings in which preferred embodiments incorporating the principle of the present invention are shown by way of illustrative example.

DETAILED DESCRIPTION OF THE PREFERRED EMBODIMENT

The present invention will be described in detail with reference to the accompanying drawings (FIGS. 4A–4L to FIG. 7).

Figure 4A:
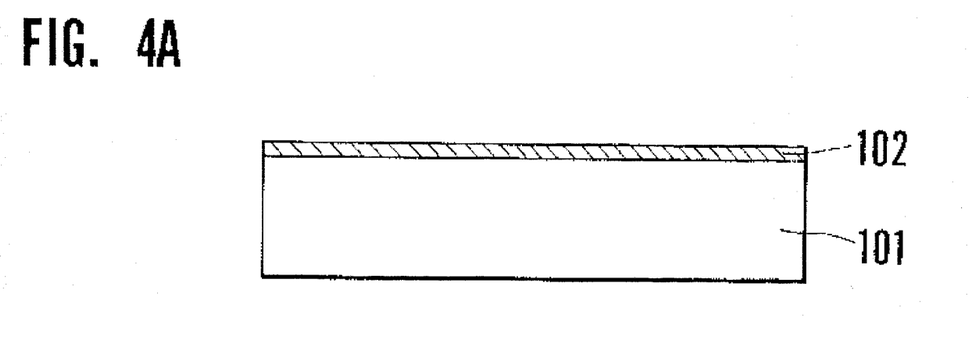
FIGS. 4A to 4L are process charts sequentially showing the steps in manufacturing a nonvolatile semiconductor memory device according to the present invention along the section of a semiconductor chip.
Figure 4L:
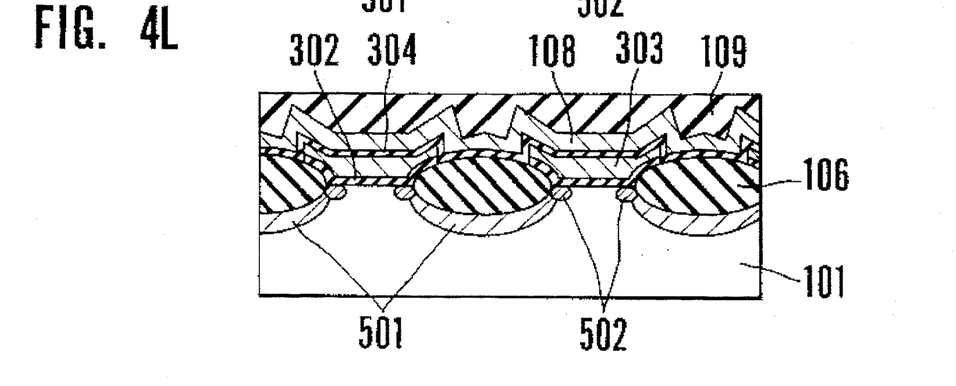
Figure 5:
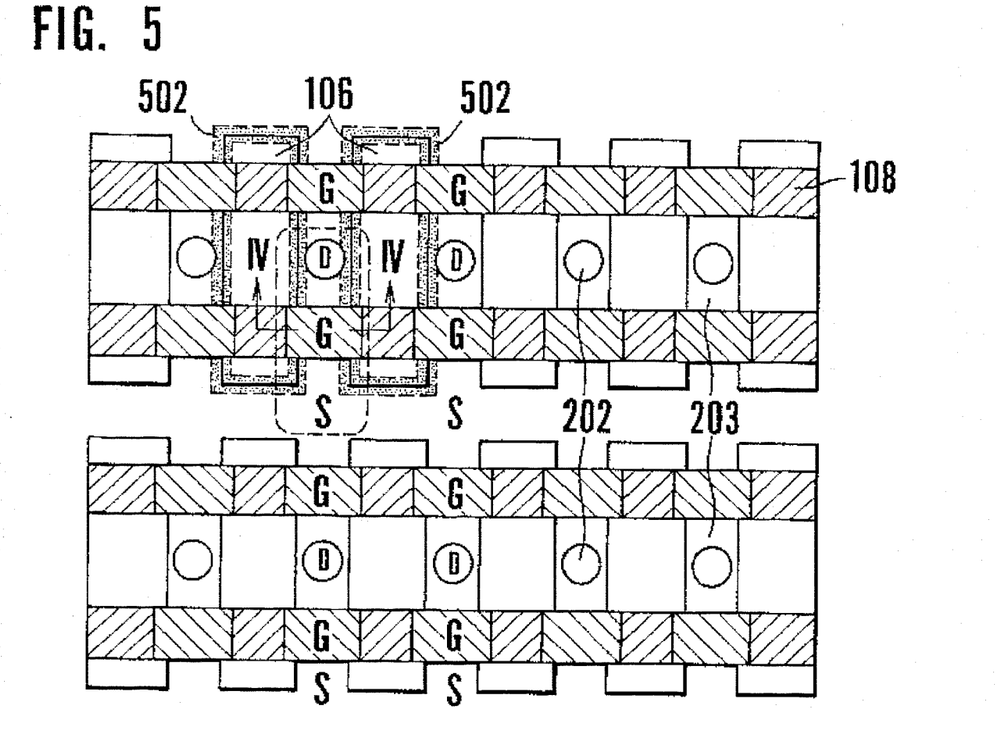
FIG. 5 is a plan view showing memory cells of the nonvolatile semiconductor memory device of the present invention.

FIG. 5 is a view showing the memory arrangement of a nonvolatile semiconductor memory device according to the present invention, which is equivalent to FIG. 2. The manufacturing process of the nonvolatile semiconductor memory device of the present invention along a section IV—IV in FIG. 5 will be described with reference to FIGS. 4A to 4L.

Figure 4B:
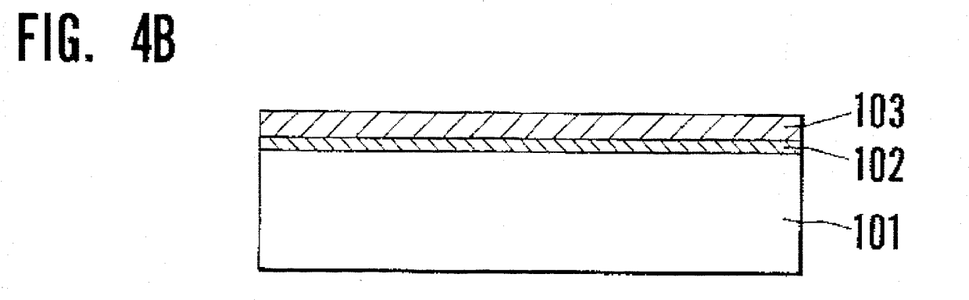
Figure 4C:
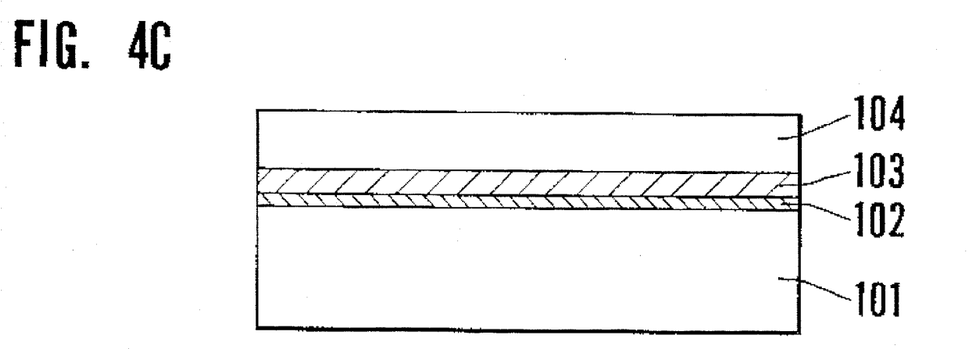
Figure 4D:
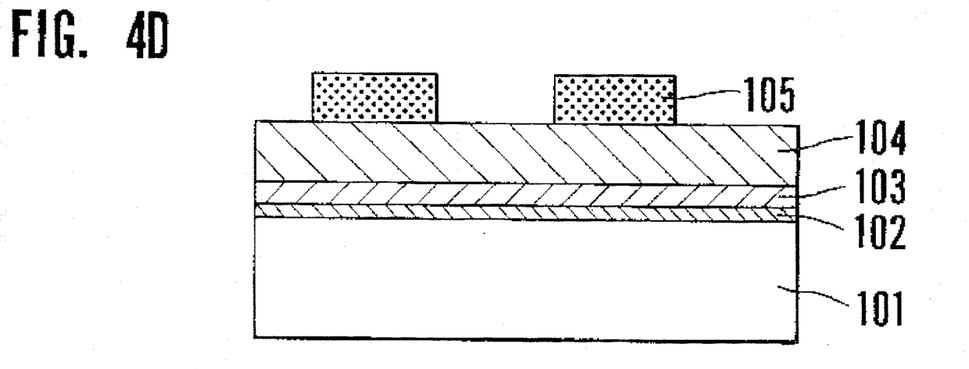

Referring to FIG. 4A, an oxide film 102 is formed on a p-type silicon substrate 101 to a thickness of, e.g., 45 nm. Polysilicon 103 is deposited on the oxide film 102 by CVD to a thickness of, e.g., 120 nm, as shown in FIG. 4B. A 300-nm thick nitride film 104 is formed on the polysilicon 103 by CVD, as shown in FIG. 4C. As shown in FIG. 4D, a photoresist 105 is patterned.

Figure 4E:
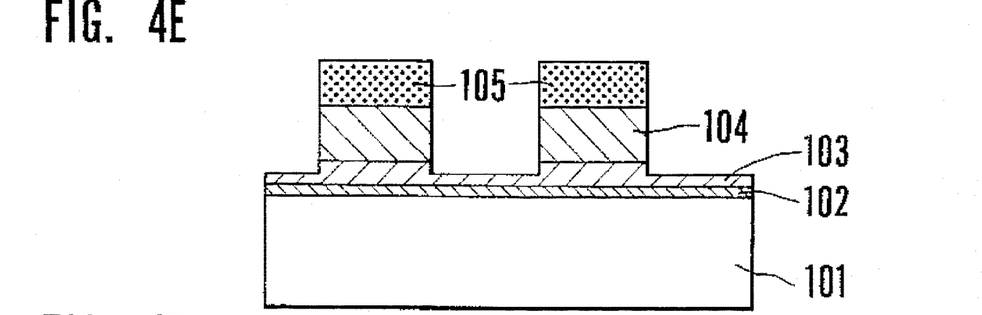
Figure 4F:
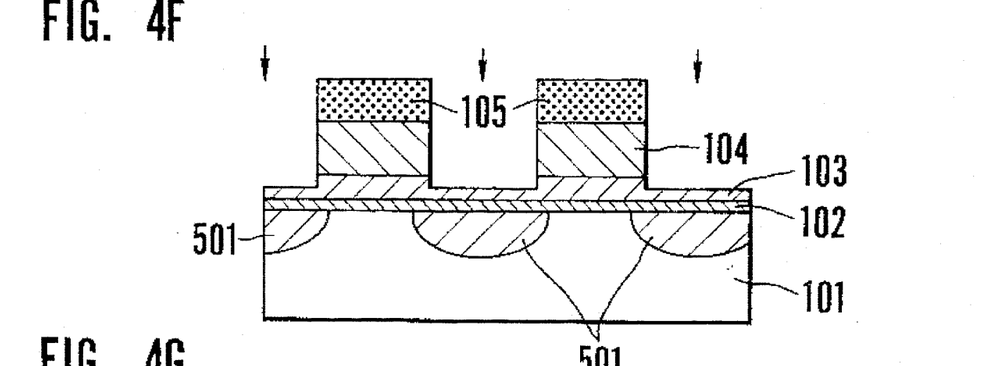
Figure 4G:
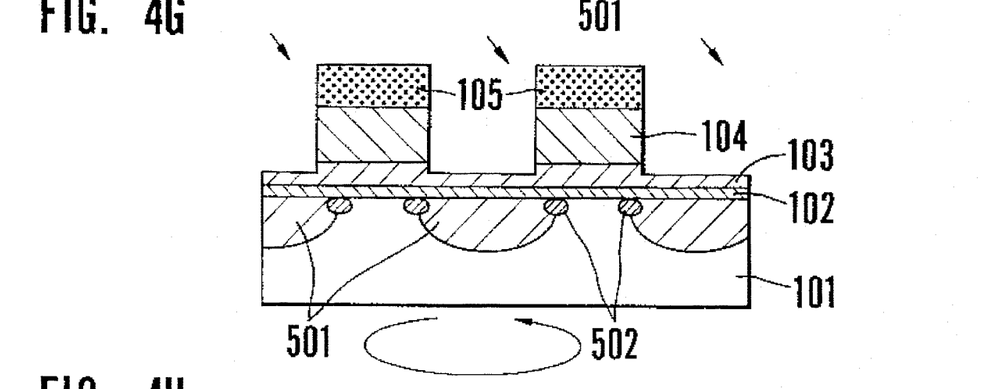
Figure 4H:
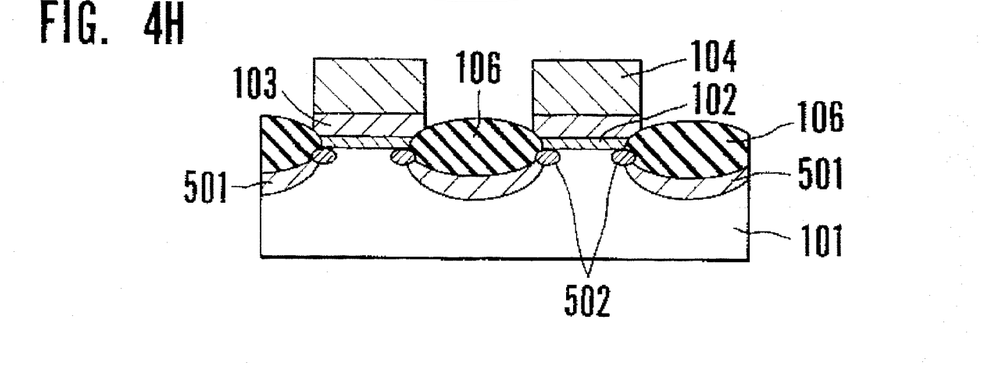

As shown in FIG. 4E, the nitride film 104 is etched using the photoresist 105 as a mask. As shown in FIG. 4F, boron is doped to form a channel stopper to electrically isolate the adjacent memory cells, as indicated by arrows, thereby forming first p-type regions 501 (FIG. 6) serving as channel stoppers. As shown in FIG. 4G, boron is obliquely doped, as indicated by arrows, while rotating the substrate 101. In this case, the ion implantation energy falls within the range of 50 to 80 keV, which is set lower than the boron doping energy for forming the channel stoppers. The dose falls within the range of $8 \times 10^{13}$ to $1 \times 10^{14}$ cm$^{-2}$, and the incident direction falls within the range of 30° to 60° with respect to a normal to the substrate. In this process, second p-type regions 502 (FIG. 6) serving as the electric field buffering means are formed. As shown in FIG. 4H, oxidation is performed to form element isolation regions 106.

Figure 4I:
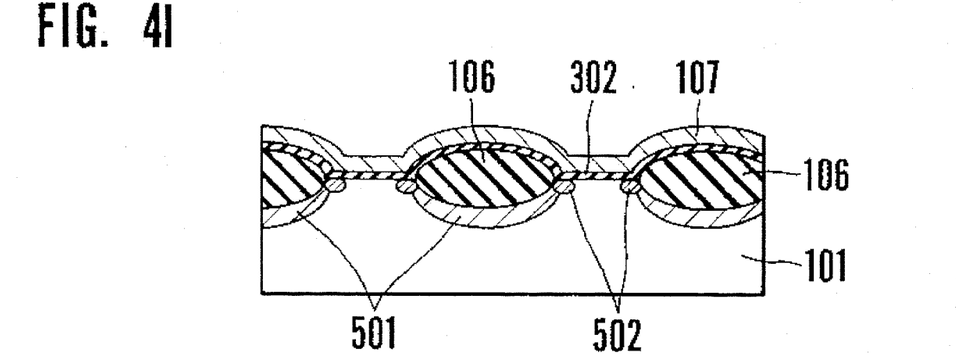
Figure 4J:
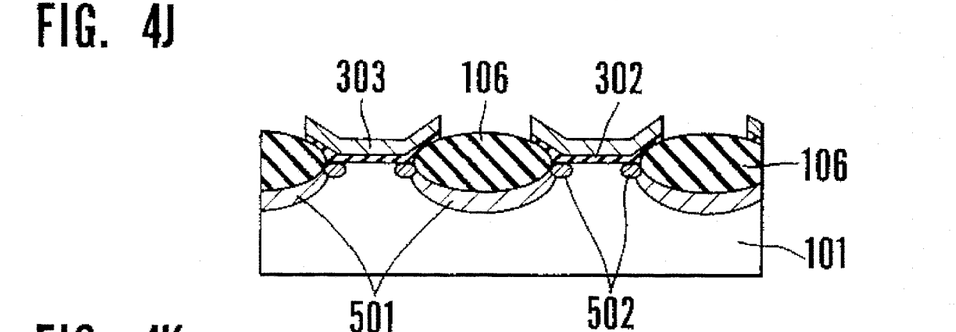
Figure 4K:
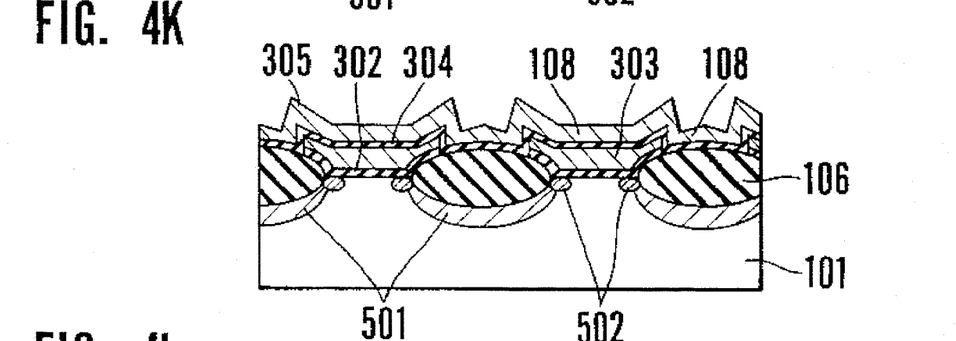

As shown in FIG. 4I, a gate oxide film 302 is formed, 150-nm thick first polysilicon 107 is grown. As shown in FIG. 4J, an unnecessary portion of the first polysilicon 107 is etched to form each polysilicon pattern which is formed into a floating gate electrode 303 later. As shown in FIG. 4K, a gate insulating film 304 and second polysilicon 108 are grown, and unnecessary portions are etched to form floating gate and control gate electrodes 303 and 305. As shown in FIG. 4L, an insulating film 109 is grown, and contact holes are formed at necessary portions to electrically connect electrodes to corresponding diffusion layers, thereby forming each memory cell.

Figure 6:
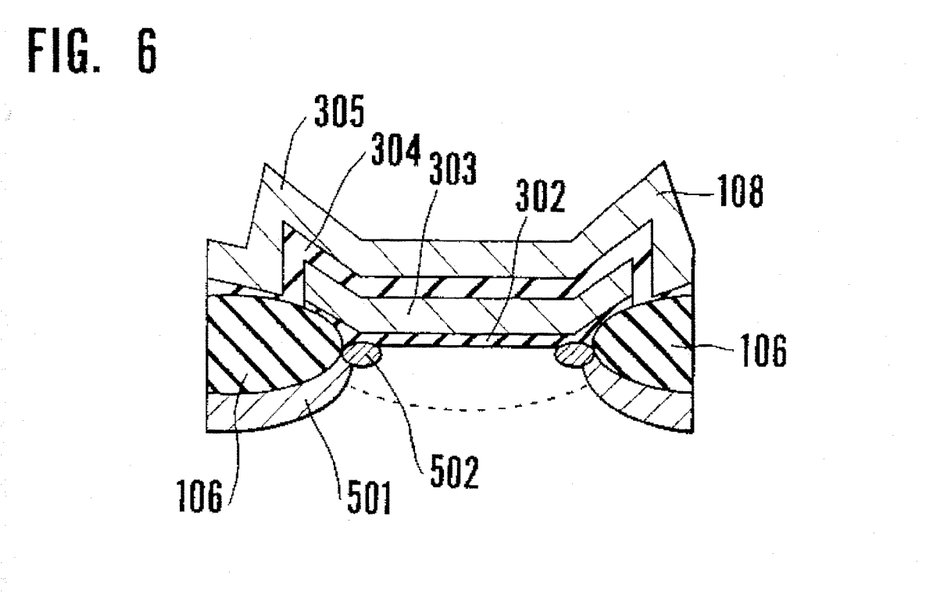
FIG. 6 is a sectional view of the nonvolatile semiconductor memory device of the present invention.

The sectional view of the resultant memory cell is shown in FIG. 6. When the memory cell is formed by this manufacturing method, the second p-type regions 502 are added to the peripheral portions of the element isolation regions 106, as compared with the conventional structure. The second p-type regions 502 are formed at only the peripheral portions of the element isolation regions 106, as shown in FIG. 5 which illustrates the memory cells (only the second p-type regions 502 are illustrated for the two element isolation regions 106 for illustrative convenience in FIG. 5). The second p-type regions 502 serve as the electric field buffering means to relax the local concentration of the electric field between the peripheral portion of the element isolation region 106 and the floating gate electrode 303. The electric field buffering means can almost eliminate the influence of element isolation.

Figure 7:
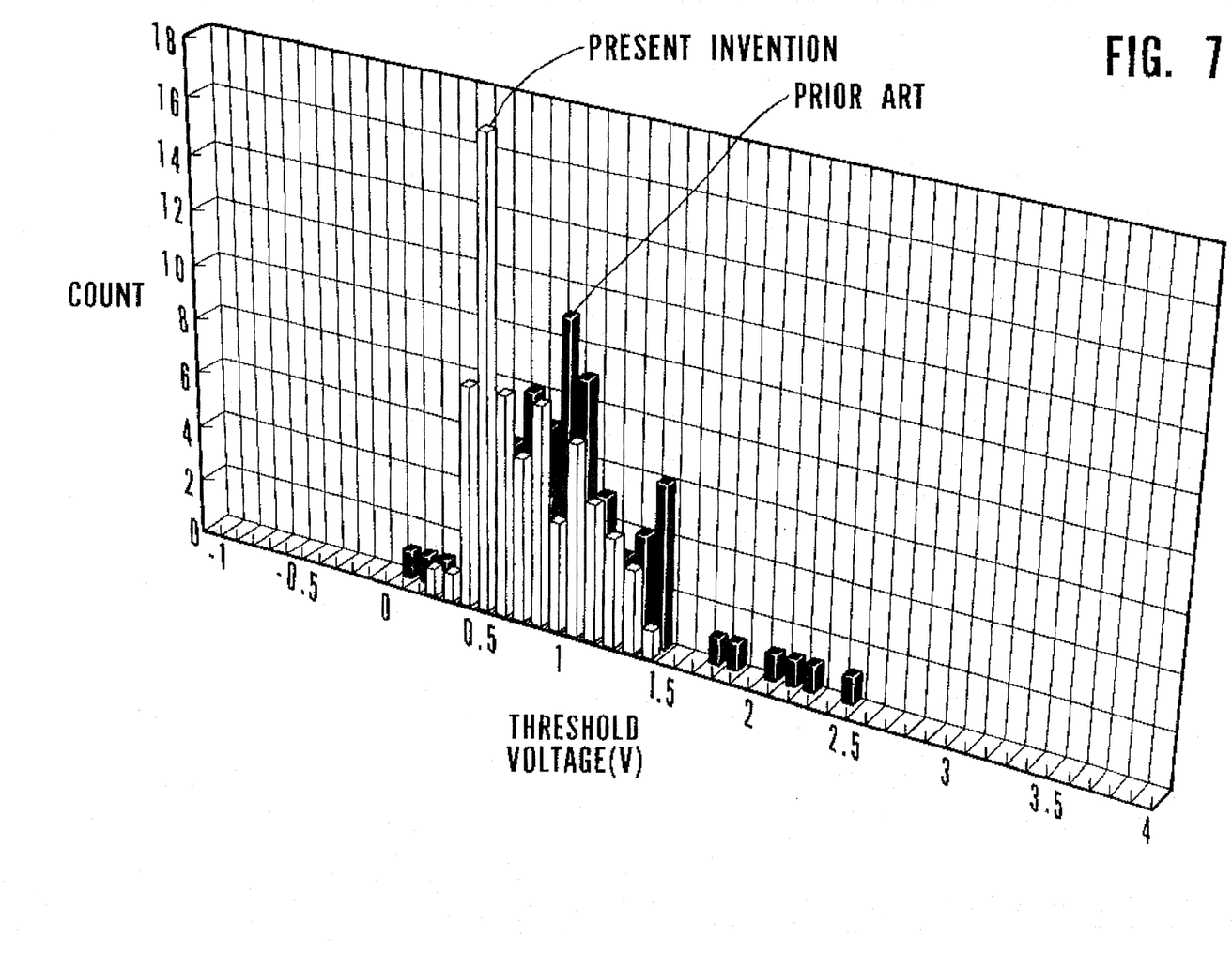
FIG. 7 is a view for comparison for variations in threshold voltages upon data erasure between the nonvolatile semiconductor memory device manufactured by the conventional manufacturing method and the nonvolatile semiconductor memory device manufactured by the manufacturing method of the present invention.

Variations in threshold voltage at 73 points on a wafer upon actual write access to memory cells and erasure of data therefrom are compared between the memory device manufactured by the method of the present invention and the memory device manufactured by the conventional method, as shown in FIG. 7.

As can be apparent from FIG. 7, according to the conventional manufacturing method, the threshold voltage varies in the range of 0.1 to 2.5 V, while the threshold voltage varies within the range of 0.3 to 1.5 V according to the present invention, thereby reducing the variations in threshold voltage.

As has been described above, according to the present invention, the electric field buffering means is formed at a peripheral portion of an element isolation region to reduce the variations in threshold voltage distribution upon erasure of data from EEPROM elements respectively constituting a plurality of memory cells.

What is claimed is:

1. An electrically erasable nonvolatile semiconductor memory device having a floating gate electrode formed on a semiconductor substrate through a first gate insulating film, a control gate electrode formed on said floating gate electrode through a second gate insulating film, and source and drain regions spaced apart from each other under said floating gate electrode so as to partially overlap said floating gate electrode, electric field buffering means for relaxing an electric field generated between a peripheral portion of an element isolation region and an end portion of said floating gate electrode in application of an erase voltage.

2. A device according to claim 1, wherein said electric field buffering means is selectively formed as a lightly doped region in a source region surface portion of said peripheral portion of said element isolation region.

* * * * *